United States Patent [19]

Desai

[11] Patent Number: 5,004,639

[45] Date of Patent: Apr. 2, 1991

[54] RIGID FLEX PRINTED CIRCUIT CONFIGURATION

[75] Inventor: Jay Desai, Corona, Calif.

[73] Assignee: Sheldahl, Inc., Northfield, Minn.

[21] Appl. No.: 468,646

[22] Filed: Jan. 23, 1990

[51] Int. Cl.⁵ .......................... B44C 1/22; C23F 1/02; B32B 3/10; H05K 1/00
[52] U.S. Cl. ...................................... 428/138; 29/852; 156/630; 156/634; 156/656; 156/661.1; 156/902; 428/192; 428/209; 428/901; 174/254; 361/398
[58] Field of Search .......................... 29/852; 174/68.5; 427/97; 361/398; 428/137, 138, 192, 209, 601, 901; 156/630, 633, 634, 656, 659.1, 661.1, 902

[56] References Cited

U.S. PATENT DOCUMENTS

| | | | |
|---|---|---|---|
| 4,037,047 | 7/1977 | Taylor | 156/629 X |
| 4,338,149 | 7/1982 | Quaschner | 156/248 |
| 4,626,462 | 12/1986 | Kober et al. | 156/630 X |
| 4,687,695 | 8/1987 | Hamby | 428/192 |
| 4,747,211 | 5/1988 | Gilleo et al. | 29/852 |
| 4,800,461 | 1/1989 | Dixon et al. | 361/398 |

Primary Examiner—William A. Powell
Attorney, Agent, or Firm—Haugen and Nikolai

[57] ABSTRACT

A process for fabricating a multi-layer flex and rigid-flex board and the board disclosed which substantially reduces the amount of expansion in the direction perpendicular to the plane of the board which occurs between laminated pattern circuit layers in a manner that substantially reduces the tendency of the through-hole plated connections to fail. This is done without sacrificing the attributes of using some flexible material in the rigid zones.

20 Claims, 2 Drawing Sheets

RIGID FLEX PRINTED CIRCUIT CONFIGURATION

BACKGROUND OF THE INVENTION

Field of the Invention

The present invention is directed generally to multi-layer combined rigid and flexible printed circuit configurations in which flexible sections extend from or join one or more rigid sections normally as part of the interconnect system used in electronic packaging.

Description of the Related Art

Processes and techniques for manufacturing multi-layer printed circuit devices have been evolving over a long period of time. In this regard, flexible circuits have been widely recognized as a substitute for wire harnesses because they are lighter, have greater flexibility, greater reliability and require less labor to assemble. As the complexity and the electrical performance requirements of printed circuits increased over a period of time there evolved a reduction in the trace widths, trace spaces and pad-to-hole ratio and, simultaneously, an increase in the complexity or number of conductor layers utilized. To meet this challenge, multi-layer flexible and rigid-flex circuits were developed.

Conventional flexible printed circuit material for rigid-flex manufacturing include Kapton (a trademark of E. I. Du Pont De Nemours and Company of wilmington, Delaware) for polyimide dielectric flexible film and acrylic adhesive materials. Other dielectric flexible files used for fabrication flexible printed circuits include Nomex, Mylar, for a polyester material and Teflon, for polytetrafluoroethylene, (all are also trademarks of Du Pont). Conventional flexible laminates consist of a flexible dielectric film such as polyimide film bonded to a copper substrate using a flexible type of adhesive. The conductive patterns on the flexible materials are formed by a print and etch operation. The etched flex layers are then laminated using heat and pressure with a cover layer material which includes a flexible dielectric film attached with a flexible type of adhesive.

Rigid printed circuit laminates are normally copper clad materials using an epoxy or a polyimide laminate. The conductive patterns on the rigid materials are also formed by a print and etch operation. The etched rigid layers are then laminated with other layers to make a rigid-flex printed circuit.

Multi-layer flexible circuits are normally built by using multiple individual flexible layers sandwiched using a flexible adhesive material for flexibility or with fiberglass sheets impregnated with a resin or adhesive such as epoxy and are known as "prepreg" (also referred to as a B-stage).

The rigid-flex printed circuits normally include individual flexible layers and rigid layers stacked to form a many-layered composite. The flexible layers are an integral part of both the flexible and rigid portions of the device; whereas, the rigid layers are normally a part of only the rigid portion of the device. Adhesive normally used to bond the rigid and flexible layers in a rigid-flex circuit board is normally either a flexible type such as an acrylic/epoxy adhesive or a rigid type, for example, glass reinforced prepreg.

The flexible dielectric and adhesive materials such as those recited above exhibit excellent flexibility, stability and heat resistance properties and can be readily bonded to copper sheets for circuit pattern delineation. However, difficulties have been encountered because of the relatively high co-efficient of thermal expansion associated with these materials compared to copper, tin/lead conductor and connecting materials. Thus, when the printed circuits using these materials are subjected to cyclical thermal environment, the flexible type of material expands and contracts at a much higher rate than the other materials used in the printed circuit fabrication.

Normally, the various layers of patterned circuits in the rigid and the flexible laminate are connected together electrically by utilizing "through-holes" which are holes drilled in the board and extending down through all the layers which are subsequently plated with a conducting material to form a coating on the inside of the hole in the form of a conductive layer which forms a common connection joining the layers connected by the given through-hole. The conductor is normally a copper or solder material depending on the application.

Because the flexible materials in the composite rigid-flex board expand at a much higher rate than the rigid materials, the expansion during soldering or other heat-related operations which take place after plating or cladding of the through-holes tends to create a great deal of stress relative to the connections between the various levels of patterned circuitry in the through-holes. If expansion along the through-holes in the direction normal to the plane of the laminated sandwich is sufficient, the integrity of the plated conductor in the holes may be broken. This also occurs after repeated cyclical stresses over a specified temperature range. In any event, this phenomenon causes failures in the printed circuits including a much higher rate of manufacturing rejection than is desirable.

One approach to solving this problem is illustrated and described in U.S. Pat. No. 4,687,695 which describes a process for making flexible printed circuits which addresses the problem of fabricating through-holes in the rigid areas of the flexible circuit. That solution involves substituting epoxy glass or conventional rigid printed circuit materials for the flexible printed circuit material in the rigid areas of the flexible printed circuits. This process avoids the process of plating through-holes in flexible printed circuit materials at all.

SUMMARY OF THE INVENTION

By means of the present invention many problems associated with thermal expansion in multi-layer flex and rigid-flex circuit boards have been solved by a provision of a process for making a new configuration of multi-layer printed circuit boards that overcomes the problems discussed above particularly related to thermal expansion. The multi-layer flex and rigid-flex board fabricated in accordance with the present invention substantially reduces the amount of expansion in the direction perpendicular to the plane of the board which occurs between laminated pattern circuit layers in a manner that substantially reduces the tendency of the through-hole plated connections to fail. This is done without sacrificing the attributes of using some flexible material in the rigid zones.

The process of the preferred embodiment includes forming conductor patterns on a pair of conductor layers of the flexible material in both the rigid and flexible sections of the device utilizing imaging and etching techniques in a well-known manner. Thereafter flexible dielectric film layer is applied to the patterned conductor layers in the flexible sections using a flexible adhesive. The conductor patterns in the rigid material are also formed by utilizing imaging and etching techniques. The rigid material may then be removed in the flexible section of the device. The adhesive material utilized to laminate flexible layers in a multi-layer flex board and rigid layers flexible layers in a rigid-flex board may be removed in the flexible section of the device to add flexibility in the flexible section. The throughholes are then drilled in the structure and the joining conducting material plated therein.

In alternate process, the first pair of conductor layers are laminated on opposite surfaces of an insulator layer which has at least a partially flexible composition on the flexible sections and a rigid composition in the rigid sections.

Both embodiments create a laminar structure in which the patterned conductor layers are separated by one or more layers of reduced expansion material at the sites of the through-holes. The configurations made by these processes shows superior thermal stability. The flex layers used in the rigid sections normally are quite thin relative to the rigid layers.

BRIEF DESCRIPTION OF THE DRAWINGS

In the drawings, wherein like numerals are utilized to designated like parts throughout the same.

DESCRIPTION OF THE PREFERRED EMBODIMENTS

Figure 1:
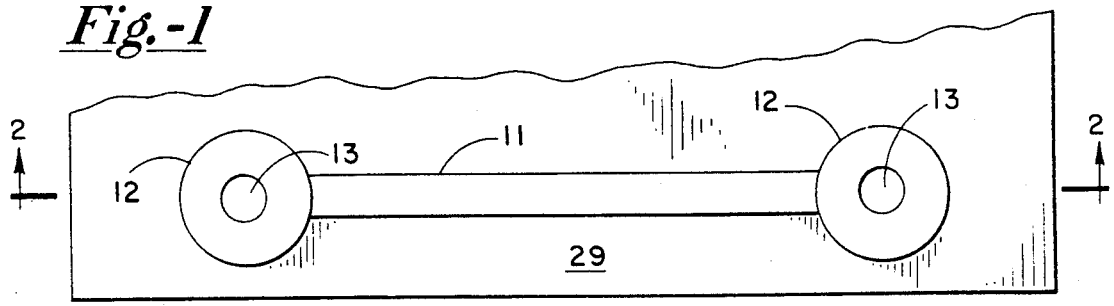
FIG. 1 is a top plane view of a fragment of a multi-layer flexible printed circuit in accordance with the invention.

FIG. 1 depicts a plan view of a fragment of a typical rigidflex multi-layer printed circuit in accordance with the invention which may contain any number of laminated layers. The figure shows a conductor, normally copper, connecting the sites of two through-holes 13 contained in terminal pads 12 situated on top of a rigid or flexible dielectric layer as at 29. The through-holes 13 are located in rigid areas of the printed circuit and are designed to contain pins or connectors which may be soldered in place in a well-known manner.

Figure 2:
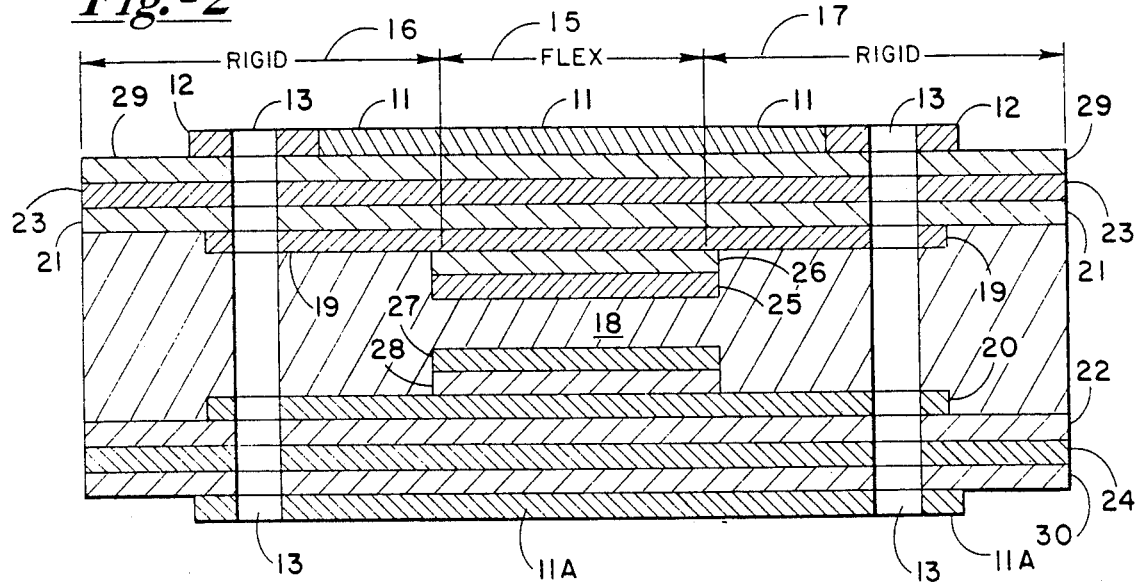
FIG. 2 is a elevational cross-section view of one embodiment of a multi-layer flexible circuit in accordance with the invention taken substantially along the lines 2—2 of FIG. 1.

As better shown in the general elevational cross-section view of FIG. 2, the fragment is generally divided into a flexible area 15 flanked by symmetrical or non-symmetrical rigid areas 16 and 17. Flexible area 15 is designed to allow the device to be connected or flexed at that point or bent as desired depending on the application. The illustrated system may, in turn, be one of many segments making up the total board thickness.

The laminated multi-layer flexible circuit board of FIG. 2 includes a central, normally rigid dielectric layer 18 which may be substantially composed of one or more fiberglass sheets impregnated with an adhesive such an epoxy commonly referred to as B-stage or prepreg. It is further understood that the layer 18 may also be composed of a flexible material, if desired. The layer 18 in the flexible area of FIG. 2 may be removed, if desired, to increase flexibility. Copper substrate layers 19 and 20 are respectively fixed by flexible adhesive layers 21 and 22 to flexible dielectric films 23 and 24. The electrical conductor layers 19 and 20 are patterned a desired by photo printing the desired circuit pattern on the material normally utilizing a negative photo resist. After the photo printing operation the unwanted copper is etched and the electrical conductors are established in the desired pattern on the copper substrate 19 or 20. Next, cover layers, each consisting of a respective flexible dielectric film layer attached by an adhesive layer are selectively attached to the flexible areas or sections. In this manner a cover layer consisting of flexible dielectric layer 25 of Kapton or the like is attached to the conductor layer 19 by adhesive 26, and dielectric layer 27 is attached to conductor layer 20 by adhesive 28. Additional flexible adhesive layers 29 and 30 attach the outer most conductive layers 11 and 11a.

The dielectric film specified in 23, 24, 25, 27 and the flexible type adhesive specified in 21, 22, 26, 28, 29 and 30 can be the same material, if desired. The cover layers such as 25 and 26 or 27 and 28, for example, are attached to the etched flexible printed circuit material using a lamination process. The lamination process utilizes heat and pressure and can be done with or without a vacuum. The cover layer is selectively laminated only in the flexible area 15 of the printed circuit so that the rigid areas 16 and 17 do not have the flexible type adhesive. So as to reduce stress concentrations at the rigid area and the flex area interface, especially when the flex area is bent, he selective cover layer lamination is preformed in a manner such that there may be a slight protrusion of the cover layer into the rigid areas 16 and 17 of the printed circuit. The protrusion of the cover layer is dependent on the specific application of the printed circuit.

This design represents an improvement over the prior art in which the cover layer lamination extended over the entire etched flexible printed circuit material encompassing both the rigid and flexible areas thereby introducing additional expansion in the direction normal to the surfaces of the layers. To introduce additional flexibility into the flexible area 15, it is further understood that the prepreg or flexible adhesive material 18 can be removed from the flexible are 15 during fabrication of the circuit.

Figure 3:
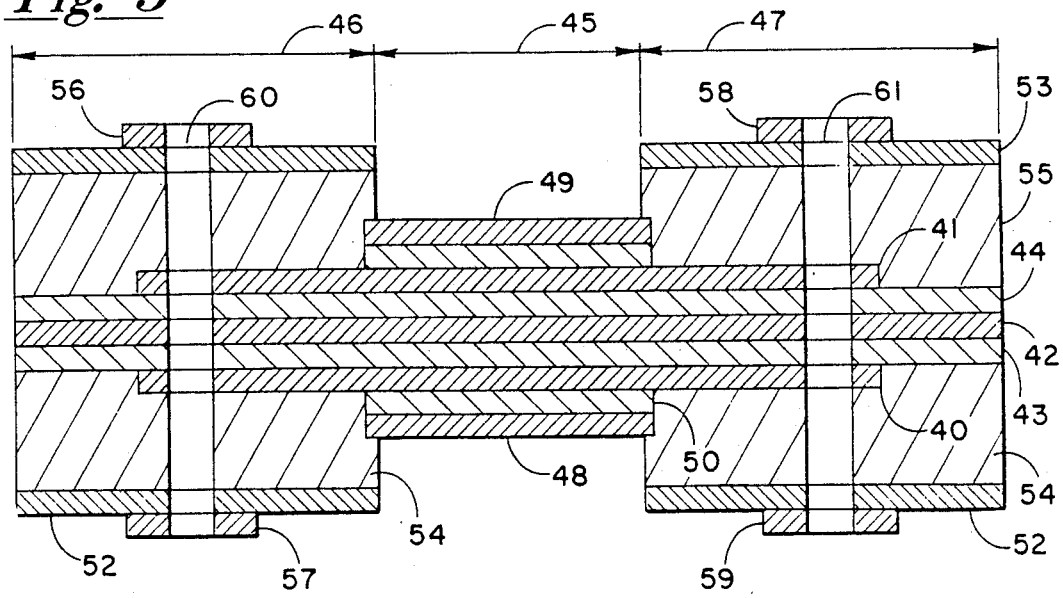
FIG. 3 is a elevational cross-section view similar to FIG. 2 of an alternative embodiment of a multi-layer rigid-flex printed circuit of the invention.

FIG. 3 depicts a cross-sectional elevational view of a rigid-flex printed circuit which represents a slightly different embodiment from that of FIG. 2. In FIG. 3, patterned circuit layers 40 and 41 with cover layers are mounted back-to-back forming a laminate including dielectric layer 42 and adhesive layers 43 and 44 extending across flexible zone 45 and rigid zones 46 and 47. The conductor layers 40 and 41 are provided with respective cover layers in the flexible zone 45 including flexible adhesive layers 48 and 49 attached by adhesive layers 50 and 51. Additional rigid laminate layers 52 and 53 are provided in the rigid areas laminated by adhesive layers 54 and 55, respectively. The adhesive material of 54 and 55 may be substantially similar to that depicted at 18 in FIG. 2. It is preferably a resin impregnated glass or prepreg which allows the system again to achieve a lower overall thermal coefficient of expansion. Additional conductor connections are shown at 56–59 associated with through-holes 60 and 61. The flexible zone 45 in accordance with the embodiment of FIG. 3, may contain no rigid layers, if dielectric layer 42 is flexible.

The rigid zones 46 and 47 are made with substantially less flexible adhesive material compared to prior devices. While not preferred, if the dielectric layers 42, 43 and 44 are rigid and layers 52–56 are also rigid, the rigid areas are free of flexible layers entirely. The rigid material 52 and 53 is normally a copper clad material comprising a rigid core of polyimide or epoxy bonded to the copper. It should be noted that the conductor layers as at 11 and 11a in FIG. 2 and 56 and 57 of FIG. 3 are not photo printed or patterned prior to the lamination process. As a result, during the lamination operation, the entire printed circuit has no unetched copper on the internal patterned conductor layers. After the lamination process, which is performed in a well-known manner under heat and pressure, with or without a vacuum, the throughholes are drilled and subsequently plated with copper and/or tin-lead solder material. Prior to plating the through-holes, a plasma process may be required to clean the through-holes. The drilling, cleaning and plating of the through-holes in the printed circuits utilizing this invention are done utilizing well-known industry standard techniques.

Figure 4:
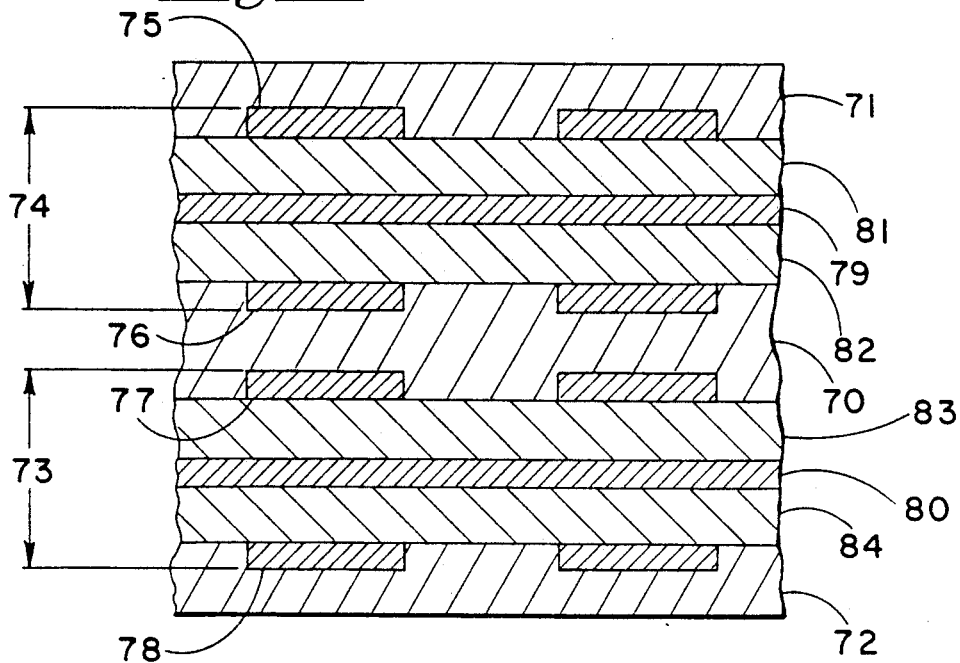
FIG. 4 depicts the flexible material layers of a portion of the rigidized area of the configuration of FIGS. 2 and 3.

FIG. 4 shows a rigid area material stack-up or laminated layered structure of a possible embodiment of the invention. This can be compared and contrasted with the rigid area material stack-up of FIG. 5 which illustrates a prior standard construction. The material stack-up of FIG. 4 can be divided into three relatively rigid dielectric prepreg layers including a central rigid layer 70 and outer rigid layers 71 and 72 separated by etched di-clad flex layers 73 and 74 which include patterned circuits as at 75, 76, 77 and 78 separated by dielectric layers 79 and 80, joined by adhesive layers 81, 82, 83, and 84. Note the predominance of rigid layers in the structure.

Figure 5:
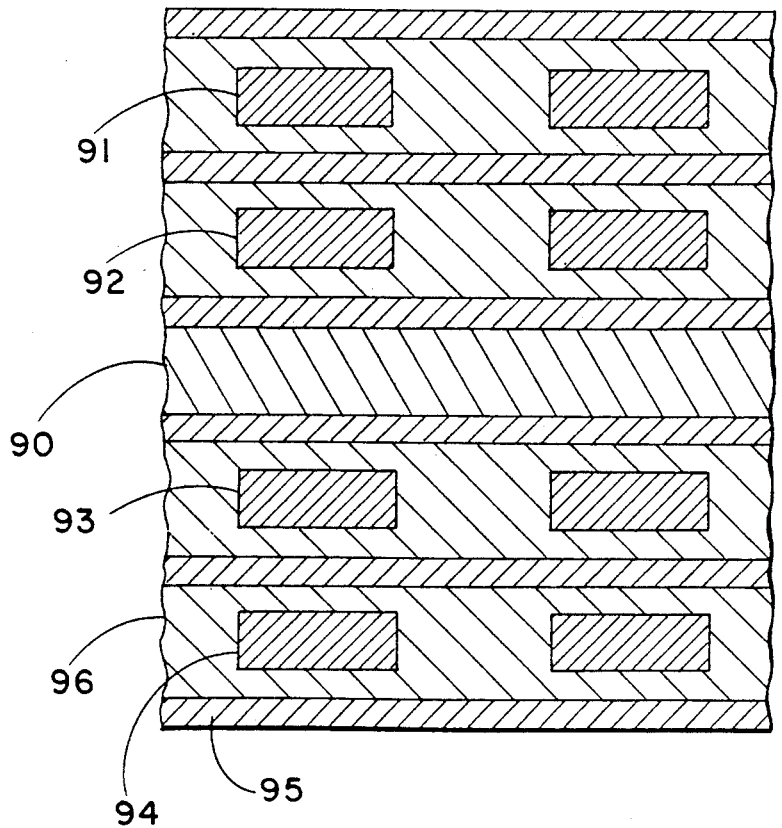
FIG. 5 depicts a layered material stacked up in the rigidized area of a typical prior art multi-layer flex and multilayer rigid-flex printed circuit.

The material stack-up illustrated in FIG. 5 includes only one central rigid or prepreg layer 90 separating the etched conductors shown at 91, 92, 93 and 94. The remainder of the materials consist of alternate layers of soft dielectric material such as Kapton and acrylic adhesive as at 95 and 96, respectively. FIG. 5, then, illustrates the great predominance of flexible materials making up the laminate of the prior art. By replacing most of the flexible layers in the laminate by rigid materials in the rigid areas or zones of the multi-layer circuit board, the stresses due to unequal expansion in the direction perpendicular to the plane of the layers is substantially reduced. While it has been found in accordance with the present invention that all of the flexible material can be eliminated from the rigid sections, for most applications thermal stresses are sufficiently reduced by the replacement of some of the flexible layers with rigid layers to eliminate it as a problem. Likewise, with respect to the flexible areas, the complete elimination of the rigid materials may be desireable for some applications but not necessary for many others. The present invention does provide rigid sections incorporating insulating materials which, when subjected to elevated temperatures, do not expand sufficiently in the direction perpendicular to the plane of lamination to cause failure of the circuit.

What is claimed is:

1. A process for fabricating a rigid-flex printed circuit structure having rigid and flexible sections comprising the steps of:
   acquiring a first pair of conductor layers laminated on opposite surfaces of a central insulator layer wherein said insulator layer is further processed to be of a first composition in the rigid sections and of a second composition in the flexible section;
   forming first conductor patterns in said first pair of conductor layers by imaging and etching;
   laminating a first pair of dielectric film layers over said first conductor patterns in both said rigid and said flexible sections;
   laminating a second pair of conductor layers on said pair of first dielectric film layers;
   drilling holes through the rigid section;
   plating through the holes with conductor material to form a conductive lining therein said lining connecting conductors in the conductor patterns of the conductor layers where they meet the holes.

2. The process of claim 1 wherein said insulator layer sandwiched between said first pair of conductor layers is of a rigid material in said rigid sections and, at least in part, of a flexible material in said flexible sections.

3. The process of claim 2 wherein said central insulator layer in said flexible section further comprises at least one flexible dielectric layer between said first pair of conductor layers.

4. The process of claim 3 comprising the further step of removing said insulator material from said flexible section.

5. The process of claim 3 wherein said central insulator layer in said flexible section comprises a pair of dielectric film layers are laminated to facing sides of said conductor patterns using a flexible adhesive.

6. The process of claim 1 wherein said first pair of dielectric layers and said second pair of conductor layers are laminated over said first pair of conductor layers using a flexible adhesive in both said rigid and said flexible sections.

7. The process of claim 1 further comprising the step of cleaning the drilled holes prior to plating through the holes with the conductor material.

8. A process for fabricating a rigid-flex printed circuit structure having rigid and flexible sections comprising the steps of:
   laminating a first pair of conductor layers on opposite surfaces of a first dielectric layer wherein said first dielectric layer extends through both rigid and flexible sections;
   forming conductor patterns in said conductor layers by imaging and etching;
   selectively laminating a pair of first flexible dielectric film layers to said conductor layers in said flexible section;
   applying a pair of over layers of rigid conductor material to said first pair of conductor layers in said rigid sections using an adhesive material;
   drilling holes in the rigid sections of the printed circuit structure;
   plating through the holes with a conductive material to form conductive layers therein, said layers connecting conductors in the conductor pattern of the conductor layers where they meet the holes.

9. The process of claim 8 including the step of removing the adhesive used to laminate said pair of over layers of rigid material from said flexible section.

10. The process of claim 8 wherein said pair of over layers of rigid conductor material are of a rigid copper clad materials.

11. The process of claim 1 further comprising the process of wherein said flexible dielectric material is polyimide.

12. The process of claim 1 wherein said flexible adhesive material is an acrylic adhesive.

13. The process of claim 1 wherein said rigid dielectric material is impregnated fiberglass.

14. The process of claim 8 further comprising the process of claim 1 wherein said flexible dielectric material is polyimide.

15. The process of claim 8 wherein said flexible adhesive material is an acrylic adhesive.

16. The process of claim 8 wherein said rigid conductor material is copper clad impregnated fiberglass.

17. The process of claim 8 wherein said first dielectric layer is rigid.

18. A multi-layer flexible circuit board made according to the process of claim 1.

19. A multi-layer flexible circuit board made according to the process of claim 8.

20. A multi-layer flexible circuit board made according to the process of claim 16.

* * * * *